United States Patent [19]

Moorman

[11] Patent Number: 5,256,979
[45] Date of Patent: Oct. 26, 1993

[54] METHOD AND APPARATUS FOR MEASURING AN UNKNOWN VOLTAGE, AND POWER METER EMPLOYING THE SAME

[75] Inventor: Michael C. Moorman, Princeton, N.J.

[73] Assignee: ABB Power T&D Company Inc., Blue Bell, Pa.

[21] Appl. No.: 839,789

[22] Filed: Feb. 21, 1992

[51] Int. Cl.⁵ ............................................. G01R 27/00
[52] U.S. Cl. .................................. 324/713; 324/140 R
[58] Field of Search ............... 324/704, 713, 98, 99 D, 324/101, 140 R, 140 D

[56] References Cited

U.S. PATENT DOCUMENTS

| | | | |
|---|---|---|---|
| 3,320,530 | 5/1967 | Pearlman | 324/704 |
| 3,454,877 | 7/1969 | Julie . | |
| 3,519,931 | 7/1970 | Bradley | 324/98 |
| 3,614,611 | 10/1971 | Benjamin . | |
| 3,702,401 | 11/1972 | Parkin . | |
| 4,274,143 | 6/1981 | Brodie et al. . | |
| 4,786,859 | 11/1988 | Arseneau et al. . | |

*Primary Examiner*— Snow
*Attorney, Agent, or Firm*—Woodcock Washburn Kurtz Mackiewicz & Norris

[57] ABSTRACT

A method for measuring an unknown voltage ($V_{IN}$) using a voltage divider network in such a way that uncertainties in the values of the resistances do not affect the measurement. The unknown voltage is divided into three fractional voltages, the fractional voltages are measured, and the unknown voltage is computed on the basis of the fractional voltages. The unknown voltage is divided with a voltage divider comprising first, second and third resistors, and a first voltage ($V_{o1}$) is measured across the first resistor, a second voltage ($V_{o2}$) is measured across the second resistor and a third voltage ($V_{o3}$) is measured across the third resistor. The unknown voltage $V_{IN}$ is computed in accordance with the equations disclosed in the specification.

33 Claims, 2 Drawing Sheets

METHOD AND APPARATUS FOR MEASURING AN UNKNOWN VOLTAGE, AND POWER METER EMPLOYING THE SAME

FIELD OF THE INVENTION

The present invention generally relates to the field of voltage measurement techniques, and more particularly relates to voltage measurement techniques for use in an electronic power meter.

BACKGROUND OF THE INVENTION

In electronic power meters it is necessary to accurately measure a voltage that has a large amplitude or at least a large average or RMS value. One measurement approach is to divide the voltage with a resistive voltage divider down to a range of values that can be measured with a conventional voltage measuring device, such as an analog-to-digital converter (ADC). However, the accuracy of a measurement obtained by the conventional method is limited by the uncertainty in the values of the resistances of the voltage divider. The accuracy of the resistance values may be diminished by a number of factors, including temperature effects and the effects of being subjected to over-voltage conditions. Moreover, the initial accuracy of the resistance values may be less than ideal.

It is therefore a goal of the present invention to provide a technique for accurately measuring an unknown voltage with a voltage divider network whose component values are not known with certainty.

SUMMARY OF THE INVENTION

The present invention encompasses methods for measuring an unknown voltage ($V_{IN}$) using a voltage divider network in such a way that uncertainties in the values of the resistances (e.g., caused by variations in temperature) do not affect the measurement. Methods in accordance with the present invention comprise the steps of dividing the unknown voltage into at least three fractional voltages, measuring the fractional voltages, and computing the unknown voltage on the basis of the fractional voltages.

In a preferred embodiment, the step of dividing the unknown voltage comprises the step of dividing the unknown voltage with a voltage divider comprising first, second and third resistor means, and the step of measuring the fractional voltages comprises the steps of measuring a first voltage ($V_{o1}$) across the first resistor means, measuring a second voltage ($V_{o2}$) across the second resistor means and measuring a third voltage ($V_{o3}$) across the third resistor means.

The step of computing the unknown voltage may comprise computing $V_{IN}$ in accordance with the equation:

$$V_{IN} = V_{o1} * V_{o2} * V_{o3} / \{(V_{o1} * V_{o3}) + (V_{o2} * V_{o3}) - (V_{o1} * V_{o2})\}.$$

Alternatively, $V_{IN}$ may be computed in accordance with at least one of the following equations:

$$V_{IN} = V_{o1}/K1$$

$$V_{IN} = V_{o2}/K2$$

$$V_{IN} = V_{o3}/K3,$$

where K1, K2 and K3 are each functions of $V_{o1}$, $V_{o2}$ and $V_{o3}$.

In another embodiment, K1, K2 and K3 are computed in accordance with the following equations:

$$K1 = \{(V_{o1}*V_{o3}) + (V_{o2}*V_{o3}) - (V_{o1}*V_{o2})\}/(V_{o2}*V_{o3})$$

$$K2 = \{(V_{o1}*V_{o3}) + (V_{o2}*V_{o3}) - (V_{o1}*V_{o2})\}/(V_{o1}*V_{o3})$$

$$K3 = \{(V_{o1}*V_{o3}) + (V_{o2}*V_{o3}) - (V_{o1}*V_{o2})\}(V_{o1}*V_{o2}).$$

Alternatively, K1, K2 and K3 may be computed in accordance with the equations:

$$K1 = R_2/(R_1 + R_2)$$

$$K2 = R_3/(R_1 + R_3)$$

$$K3 = R_2*R3/(R_1*R_2 + R_1*R_3 + R2*R3),$$

where $R_1$, $R_2$ and $R_3$ respectively represent the approximate resistance values of the first, second and third resistor means.

Yet another embodiment of the present invention further comprises the step of measuring a plurality of samples of each of $V_{o1}$, $V_{o2}$ and $V_{o3}$ during a plurality of cycles of the unknown voltage.

Another embodiment further comprises the step of reordering the sequence in which the samples $V_{o1}$, $V_{o2}$ and $V_{o3}$ are measured.

Still yet another embodiment further comprises the step of computing average values of K1, K2 and K3.

In a preferred embodiment each of $V_{o1}$, $V_{o2}$ and $V_{o3}$ are sampled at approximately 2.4 kHz.

Still another embodiment of the invention further comprises the step of interleaving the samples.

Another embodiment further comprises the step of low pass filtering K1, K2 and K3.

The present invention also encompasses apparatus comprising voltage divider means for dividing the unknown voltage into at least three fractional voltages, measuring means for measuring the fractional voltages, and computing means for computing the unknown voltage on the basis of the fractional voltages.

An electronic power meter in accordance with the present invention comprises voltage divider means for dividing an unknown voltage into at least three fractional voltages ($V_{o1}$, $V_{o2}$, $V_{o3}$), measuring means, including an analog-to-digital converter, for measuring and digitalizing the fractional voltages, and computing means for computing the unknown voltage in accordance with at least one of the following equations:

$$V_{IN} = V_{o1}/K1$$

$$V_{IN} = V_{o2}/K2$$

$$V_{IN} = V_{o3}K3$$

$$V_{IN} = V_{o1}*V_{o2}*V_{o3}/\{(V_{o1}*V_{o3}) + (V_{o2}*V_{o3}) - (V_{o1}*V_{o2})\},$$

where K1, K2 and K3 are each functions of $V_{o1}$, $V_{o2}$ and $V_{o3}$.

Other features of the invention are described below in connection with the detailed description of preferred embodiments.

DETAILED DESCRIPTION OF PREFERRED EMBODIMENTS

It is well known that a set of N simultaneous equations with N unknowns can be solved for each of the N unknowns. The present invention applies this concept to the measurement of a voltage through a voltage divider.

Figure 1:
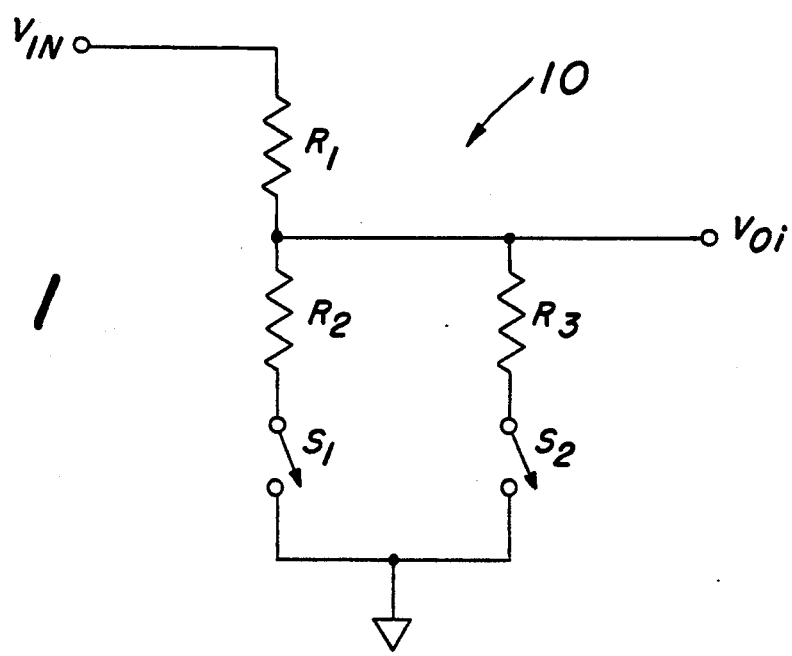
FIG. 1 is a schematic diagram of a voltage divider.

FIG. 1 depicts a resistive voltage divider network 10 comprising switches $S_1$, $S_2$ and resistors $R_1$, $R_2$, $R_3$. Switches $S_1$, $S_2$ may be considered ideal switches for the purposes of the following discussion. The output voltage $V_{oi}$ may be computed from the following three equations, which correspond to three states of the voltage divider (as discussed below, the condition $S_1$ and $S_2$ open at the same time should be avoided in power meter applications):

Condition 1: $S_1$ closed $$V_{o1} = V_{IN} * R_2/(R_1+R_2) \tag{1}$$

Condition 2: $S_2$ closed $$V_{o2} = V_{IN} * R_3/(R_1+R_3) \tag{2}$$

Condition 3: $S_1$ & $S_2$ closed $$\begin{aligned}V_{o3} &= V_{IN} * R_2 \| R_3/(R_1 + R_2 \| R_3) \\ &= V_{IN} * R_2 * R_3 / \\ &\quad (R_1 * R_2 + R_1 * R_3 + R_2 * R_3)\end{aligned} \tag{3}$$

The usual method of measuring an unknown voltage through a voltage divider employs condition 1. The output voltage $V_{o1}$ is measured and the values of the resistors $R_1$, $R_2$ are assumed to be known constants. The unknown voltage, $V_{IN}$ in this case, is then computed in accordance with equation 1. This method is especially useful in situations where the unknown voltage is expected to be large. Of course, the relationship between $V_{IN}$ and the measured voltage $V_{o1}$ will only be sufficiently known if the values of $R_1$ and $R_2$ are known to the required accuracy.

The present invention eliminates the requirement that the resistances be known. In accordance with the invention, a set of three simultaneous equations is obtained by measuring the output voltage $V_{oi}$ for each of the three conditions set forth above. This may be accomplished by first closing switch $S_1$ and measuring the output voltage $V_{o1}$, then opening switch $S_1$, closing switch $S_2$ and measuring $V_{o2}$, and finally closing both switches $S_1$, $S_2$ and measuring $V_{o3}$. Note that the unknowns, $V_{IN}$, $R_1$, $R_2$, and $R_3$, must be constant during the measurement of the three output voltages to obtain a truly simultaneous set of equations. This is a safe assumption for the resistors since the time constant of change in resistor value should be quite long compared to the measurement time. If the input voltage $V_{IN}$ is an AC signal, and therefore not constant on an instantaneous basis, it may nevertheless be assumed to be constant on an RMS or average basis during the time that it takes to measure the three output voltages. The validity of this assumption is discussed below.

Since our prime objective is to determine the value of $V_{IN}$ independent of the three resistor values, the set of equations will be solved to find three gain terms that describe the relationships between the input voltage, and the three output voltages, $V_{o1}$, $V_{o2}$, and $V_{o3}$.

First, equations (1) and (2) are reduced to express $R_2$ and $R_3$ functions of $R_1$, $V_{IN}$, $V_{o1}$ and $V_{o2}$:

$$R_2 = R_1 * V_{o1}/(V_{IN} - V_{o1}) \tag{4}$$

$$R_3 = R_1 * V_{o2}/(V_{IN} - V_{o2}) \tag{5}$$

Second, equation (3) is reduced to express $V_{IN}$ as a function of $V_{o3}$, $R_1$, $R_2$, and $R_3$.

$$V_{IN} = V_{o3} * (R_1/R_3 + R_1/R_2 + 1) \tag{6}$$

Equations (4) and (5) are then substituted into equation (6) to express $V_{IN}$ as a function of $V_{o1}$, $V_{o2}$, and $V_{o3}$:

$$V_{IN} = V_{o1} * V_{o2} * V_{o3} / \{(V_{o1} * V_{o3}) + (V_{o2} * V_{o3}) - (V_{o1} * V_{o2})\} \tag{7}$$

To a certain extent we have achieved our objective since we have a relationship for $V_{IN}$ that is both independent of the resistor values and a function of voltages that can be accurately measured. However, it is advantageous to know the relationship between the input voltage and each of the respective output voltages for electronic power meter applications where it is necessary to continuously know the input voltage level. In this specification these relationships are referred to as K1, K2, and K3 for $V_{o1}$, $V_{o2}$, and $V_{o3}$, respectively.

K1, K2 and K3 are defined by the following equations:

$$V_{IN} = K1 * V_{o1}$$

$$V_{IN} = K2 * V_{o2}$$

$$V_{IN} = K3 * V_{o3}$$

From equation (1), K1 is shown to be a function of $R_1$ and $R_2$.

$$K1 = R_2/(R_1+R_2) \tag{8}$$

Substituting equations (4) and (7) into equation (8), K1 can be reduced to a function of $V_{o1}$, $V_{o2}$, and $V_{o3}$:

$$K1 = \{(V_{o1}*V_{o3})+(V_{o2}*V_{o3})-(V_{o1}*V_{o2})\}/(V_{o2}*V_{o3}) \tag{9}$$

Similarly, K2 and K3 can also be reduced to functions of $V_{o1}$, $V_{o2}$ and $V_{o3}$:

$$K2 = \{(V_{o1}*V_{o3})+(V_{o2}*V_{o3})-(V_{o1}*V_{o2})\}/(V_{o1}*V_{o3}) \tag{10}$$

$$K3 = \{(V_{o1}*V_{o3})+(V_{o2}*V_{o3})-(V_{o1}*V_{o2})\}/(V_{o1}*V_{o2}) \tag{11}$$

Since it is expected that the values of $R_1$, $R_2$, and $R_3$ will change slowly, then K1, K2, and K3 are also expected to change slowly. The present invention takes advantage of this situation to minimize any problems introduced by the RMS or average input voltage varying. According to the present invention, the RMS or average output voltage is measured during one cycle of the line voltage for each condition, i.e., it will take 3 cycles of the line voltage to solve one set of equations. K1, K2 and K3 are computed every 3rd cycle of the line voltage on a continuous basis. In addition, K1, K2, and K3 are averaged over many cycles to minimize the effect of random variations of the input voltage $V_{IN}$.

Moreover, the sequence in which the three conditions are employed is changed to minimize the effect of systematic changes of the input voltage.

Figure 2:
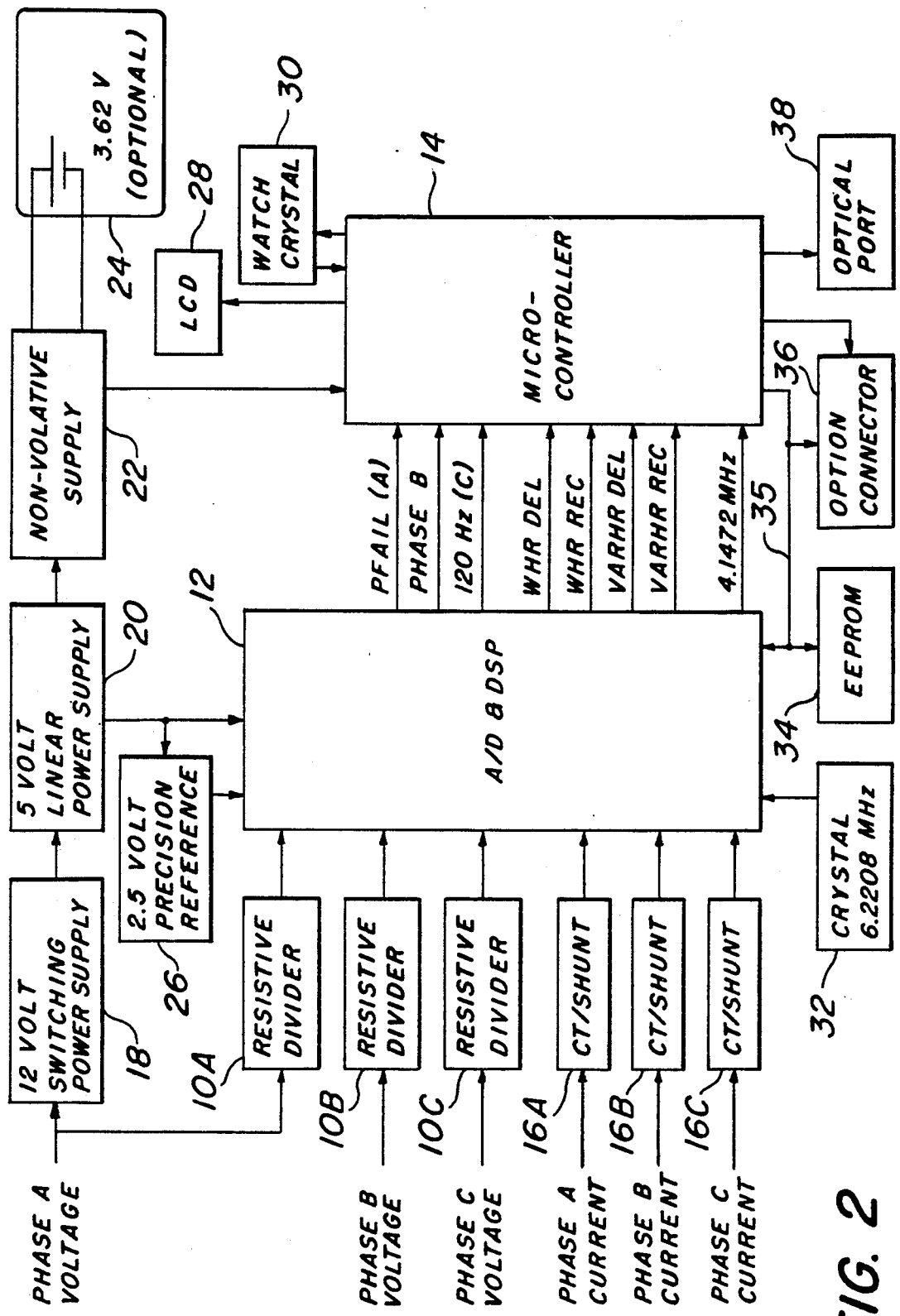
FIG. 2 is a block diagram of a power meter in accordance with the present invention.

FIG. 2 is a block diagram of a power meter employing the above-described teachings of the present invention. That meter is briefly described below to set forth a preferred environment for the invention. Further information on the meter is provided in U.S. patent application Ser. No. 839,183, filed Feb. 2, 1992, which is hereby incorporated by reference into this specification.

The power meter depicted in FIG. 2 comprises three resistive voltage divider networks 10A, 10B, 10C of the type described above with reference to FIG. 1; an ADC/DSP (analog-to-digital converter/digital signal processor) chip 12; a microcontroller 14 (e.g., a Mitsubishi Model 50428 microcontroller); three current sensors 16A, 16B, 16C; a 12 V switching power supply 18 that is capable of receiving inputs in the range of 96–528 V; a 5 V linear power supply 20; a non-volatile power supply 22 that switches to a battery 24 when 5 V supply 20 is inoperative (this feature is especially useful for a time of use meter that keeps track of the actual time of day); a 2.5 V precision voltage reference 26; an LCD display 28; a 32.768 kHz oscillator (which may be used to keep time when power fails or when the 120 Hz line to microcontroller 14 (discussed below) is inoperative; a 6.2208 MHz oscillator 32 that provides timing signals to the ADCs (not shown) inside chip 12 and whose signal is divided by 1.5 to provide a 4.1472 MHz clock signal to microcontroller 14; a 2 kBytes EEPROM 34 that may be used to store meter-type identification data that may be downloaded by block 12; a serial communications line 35; an option connector 36; and an optical communications port 38 that may be used to read the meter.

The line labelled "PFail (A)" is used to input signals to microcontroller 14 indicating power failure and the presence or absence of phase A voltage. The line labelled "Phase B" is used to input signals indicating when phase B voltage is present. The line labelled "120 Hz (C)" is used to input signals indicating the presence of phase C voltage and to input a 120 Hz (two times the line frequency of 60 Hz) signal used by microcontroller 14 for timing. (Phase A, Phase B and Phase C represent the three voltages generated in a three-phase power generation system.) The lines labelled "Whr Del" and "Whr Rec" carry signals indicating Watt-hours delivered and received, respectively, and the lines labelled "Varhr Del" and "Varhr Rec" respectively carry signals indicating apparent power delivered and received. The line labelled "4.1472 MHz" carries a clock signal to the microcontroller.

The true scope of the present invention as set forth in the following claims is not limited to the specific embodiments described above. For example, the voltage divider networks 10A, 10B, 10C could be implemented inside the ADC/DSP block 12. This would reduce the number of parts, but would require the divider current to enter the chip, which may be undesirable. Implementing the dividers as shown above, external to block 12, requires that two external drive lines per phase (one for each switch $S_1$, $S_2$) be provided and that six additional pins be provided on block 12. In addition, it should be noted that if voltage dividers 10A, 10B, 10C are inside block 12 and both switches $S_1$ and $S_2$ are open at the same time, the output voltage $V_{o1}$ ($=V_{IN}$) may be large enough to destroy the chip. Finally, the invention is not limited to the use of a resistive voltage divider, as other types of voltage dividers or even current dividers may also be used.

What is claimed:

1. A method for measuring an unknown voltage ($V_{IN}$), comprising the steps of:
   (a) dividing said unknown voltage into at least three fractional voltages;
   (b) measuring said fractional voltages; and
   (c) computing said unknown voltage on the basis of said fractional voltages; wherein:
   step (a) comprises the step of dividing said unknown voltage with a voltage divider comprising first, second and third resistor means; and
   step (b) comprises the steps of measuring a first voltage ($V_{o1}$) across said second resistor means, measuring a second voltage ($V_{o2}$) across said third resistor means and measuring a third voltage ($V_{o3}$) across a parallel combination of said second and third resistor means.

2. The method recited in claim 1, wherein step (c) comprises the step of computing said unknown voltage in accordance with the equation:

$$V_{IN} = V_{o1} * V_{o2} * V_{o3} / \{(V_{o1}*V_{o3}) + (V_{o2}*V_{o3}) - (V_{o1}*V_{o2})\}.$$

3. The method recited in claim 1, wherein step (c) comprises the step of computing said unknown voltage in accordance with at least one of the following equations:

$$V_{IN} = V_{o1}/K1$$

$$V_{IN} = V_{o2}/K2$$

$$V_{IN} = V_{o3}/K3$$

$$V_{IN} = V_{o1}*V_{o2}*V_{o3}/\{(V_{o1}*V_{o3}) + (V_{o2}*V_{o3}) - (V_{o1}*V_{o2})\},$$

where K1, K2 and K3 are each functions of $V_{o1}$, $V_{o2}$ and $V_{o3}$.

4. The method recited in claim 3, further comprising the step of computing K1, K2 and K3 in accordance with the following equations:

$$K1 = \{(V_{o1}*V_{o3}) + (V_{o2}*V_{o3}) - (V_{o1}*V_{o2})\}/(V_{o2}*V_{o3})$$

$$K2 = \{(V_{o1}*V_{o3}) + (V_{o2}*V_{o3}) - (V_{o1}*V_{o2})\}/(V_{o1}*V_{o3})$$

$$K3 = \{(V_{o1}*V_{o3}) + (V_{o2}*V_{o3}) - (V_{o1}*V_{o2})\}(V_{o1}*V_{o2}).$$

5. The method recited in claim 3, further comprising the step of computing K1, K2 and K3 in accordance with the following equations:

$$K1 = R_2/(R_1 + R_2)$$

$$K2 = R_3/(R_1 + R_3)$$

$$K3 = R_2*R_3/(R_1*R_2 + R_3*R_3 + R_2*R_3),$$

wherein $R_1$, $R_2$ and $R_3$ respectively represent the approximate resistance values of said first, second and third resistor means.

6. The method recited in claim 3, further the step of measuring a plurality of samples of each of $V_{o1}$, $V_{o2}$ and $V_{o3}$ during a plurality of cycles of said unknown voltage.

7. The method recited in claim 6, further comprising the step of reordering the sequence in which the samples $V_{o1}$, $V_{o2}$ and $V_{o3}$ are measured.

8. The method recited in claim 6, further comprising the step of computing average values of K1, K2 and K3.

9. The method recited in claim 6, wherein each of $V_{o1}$, $V_{o2}$ and $V_{o3}$ are sampled at approximately 2.4 kHz.

10. The method recited in claim 6, further comprising the step of interleaving said samples.

11. The method recited in claim 6, further the step of low pass filtering K1, K2 and K3.

12. The method recited in claim 3, further comprising the steps of:

measuring a plurality of samples of each of $V_{o1}$, $V_{o2}$ and $V_{o3}$ during a plurality of cycles of said unknown voltage;

computing K1, K2 and K3 in accordance with the following equations:

$$K1 = \{(V_{o1}*V_{o3}) + (V_{o2}*V_{o3}) - (V_{o1}*V_{o2})\}/(V_{o2}*V_{o3})$$

$$K2 = \{(V_{o1}*V_{o3}) + (V_{o2}*V_{o3}) - (V_{o1}*V_{o2})\}/(V_{o1}*V_{o3})$$

$$K3 = \{(V_{o1}*V_{o3}) + (V_{o2}*V_{o3}) - (V_{o1}*V_{o2})\}(V_{o1}*V_{o2});$$
and low pass filtering K1, K2 and K3.

13. An apparatus for measuring an unknown voltage ($V_{IN}$), comprising:
 (a) voltage divider means for dividing the said unknown voltage into at least three fractional voltages;
 (b) measuring means for measuring said fractional voltages; and
 (c) computing means for computing said unknown voltage on the basis of said fractional voltages; wherein:
  said voltage divider means comprises first, second and third resistor means; and
  said measuring means comprises means for measuring a first voltage ($V_{o1}$) across said second resistor means, measuring a second voltage ($V_{o2}$) across said third resistor means and measuring a third voltage ($V_{o3}$) across a parallel combination of said second and third resistor means.

14. The apparatus recited in claim 13, wherein said computing means comprises means for computing said unknown voltage in accordance with the equation:

$$V_{IN} = V_{o1}*V_{o2}*V_{o3}/\{(V_{o1}*V_{o3}) + (V_{o2}*V_{o3}) - (V_{o1}*V_{o2})\}.$$

15. The apparatus recited in claim 13 wherein said computing means comprises means for computing said unknown voltage in accordance with at least one of the following equations:

$$V_{IN} = V_{o1}/K1$$

$$V_{IN} = V_{o2}/K2$$

$$V_{IN} = V_{o3}/K3$$

$$V_{IN} = V_{o1}*V_{o2}*V_{o3}/\{(V_{o1}*V_{o3}) + (V_{o2}*V_{o3}) - (V_{o1}*V_{o2})\},$$

where K1, K2 and K3 are each functions of $V_{o1}$, $V_{o2}$ and $V_{o3}$.

16. The apparatus recited in claim 15, further comprising means for computing K1, K2 and K3 in accordance with the following equations:

$$K1 = \{(V_{o1}*V_{o3}) + (V_{o2}*V_{o3}) - (V_{o1}*V_{o2})\}/(V_{o2}*V_{o3})$$

$$K2 = \{(V_{o1}*V_{o3}) + (V_{o2}*V_{o3}) - (V_{o1}*V_{o2})\}/(V_{o1}*V_{o3})$$

$$K3 = \{(V_{o1}*V_{o3}) + (V_{o2}*V_{o3}) - (V_{o1}*V_{o2})\}(V_{o1}*V_{o2}).$$

17. The apparatus recited in claim 15, further comprising means for computing K1, K2 and K3 in accordance with the following equations:

$$K1 = R_2/(R_1 + R_2)$$

$$K2 = R_3/(R_1 + R_3)$$

$$K3 = R_2*R_3/(R_1*R_2 + R_1*R_3 + R_2*R_3),$$

where $R_1$, $R_2$ and $R_3$ respectively represent the approximate resistance values of said first, second and third resistor means.

18. The apparatus recited in claim 15, further comprising means for measuring a plurality of samples of each of $V_{o1}$, $V_{o2}$ and $V_{o3}$ during a plurality of cycles of said unknown voltage.

19. The apparatus recited in claim 18, further comprising means for reordering the sequence in which the samples $V_{o1}$, $V_{o2}$ and $V_{o3}$ are measured.

20. The apparatus recited in claim 18, further comprising means for computing average values of K1, K2 and K3.

21. The apparatus recited in claim 18, further comprising means for sampling each of $V_{o1}$, $V_{o2}$ and $V_{o3}$ at approximately 2.4 kHz.

22. The apparatus recited in claim 18, further comprising means for interleaving said samples.

23. The apparatus recited in claim 18, further comprising means for low pass filtering K1, K2 and K3.

24. The apparatus recited in claim 15, further comprising:

means for measuring a plurality of samples of each of $V_{o1}$, $V_{o2}$ and $V_{o3}$ during a plurality of cycles of said unknown voltage;

means for computing K1, K2 and K3 in accordance with the following equations:

$$K1 = \{(V_{o1}*V_{o3}) + (V_{o2}*V_{o3}) - (V_{o1}*V_{o2})\}/(V_{o2}*V_{o3})$$

$$K2 = \{(V_{o1}*V_{o3}) + (V_{o2}*V_{o3}) - (V_{o1}*V_{o2})\}/(V_{o1}*V_{o3})$$

$$K3 = \{(V_{o1}*V_{o3}) + (V_{o2}*V_{o3}) - (V_{o1}*V_{o2})\}(V_{o1}*V_{o2});$$
and means for low pass filtering K1, K2 and K3.

25. An electronic power meter, comprising:
 (a) voltage divider means for dividing an unknown voltage into at least three fractional voltages ($V_{o1}$, $V_{o2}$, $V_{o3}$);
 (b) measuring means, including an analog-to-digital converter, for measuring and digitalizing said fractional voltages; and
 (c) computing means for computing said unknown voltage in accordance with at least one of the following equations:

$$V_{IN} = V_{o1}/K1$$

$$V_{IN} = V_{o2}/K2$$

$$V_{IN} = V_{o3}/K3$$

$$V_{IN} = V_{o1}*V_{o2}*V_{o3}/\{(V_{o1}*V_{o3}) + (V_{o2}*V_{o3}) - (V_{o1}*V_{o2})\},$$

where K1, K2 and K3 are each functions of $V_{o1}$, $V_{o2}$ and $V_{o3}$.

26. The power meter recited in claim 25, further comprising means for computing K1, K2 and K3 in accordance with the following equations:

$$K1 = \{(V_{o1}*V_{o3}) + (V_{o2}*V_{o3}) - (V_{o1}*V_{o2})\}/(V_{o2}*V_{o3})$$

$$K2 = \{(V_{o1}*V_{o3}) + (V_{o2}*V_{o3}) - (V_{o1}*V_{o2})\}/(V_{o1}*V_{o3})$$

$$K3 = \{(V_{o1}*V_{o3}) + (V_{o2}*V_{o3}) - (V_{o1}*V_{o2})\}(V_{o1}*V_{o2}).$$

27. The power meter recited in claim 25, wherein said voltage divider means comprises first, second and third resistor means, and further comprising means for computing K1, K2 and K3 in accordance with the following equations:

$$K1 = R_2/(R_1 + R_2)$$

$$K2 = R_3/(R_1 + R_3)$$

$$K3 = R_2*R_3/(R_1*R_2 + R_1*R_3 + R_2*R_3),$$

where $R_1$, $R_2$ and $R_3$ respectively represent the approximate resistance values of said first, second and third resistor means.

28. The power meter recited in claim 26, further comprising means for measuring a plurality of samples of $V_{o1}$, $V_{o2}$ and $V_{o3}$ during a plurality of cycles of said unknown voltage.

29. The power meter recited in claim 28, further comprising means for reordering the sequence in which the samples $V_{o1}$, $V_{o2}$ and $V_{o3}$ are measured.

30. The power meter recited in claim 29, further comprising means for computing average values of K1, K2 and K3.

31. The power meter recited in claim 30, further comprising means for sampling each of $V_{o1}$, $V_{o2}$ and $V_{o3}$ at approximately 2.4 kHz.

32. The power meter recited in claim 31, further comprising means for interleaving said samples.

33. The power meter recited in claim 32, wherein said means for computing average values of K1, K2 and K3 comprises means for low pass filtering K1, K2 and K3.

* * * * *